United States Patent [19]
Fujita et al.

[11] Patent Number: 5,296,718
[45] Date of Patent: Mar. 22, 1994

[54] LIGHT EMITTING SEMICONDUCTOR DEVICE HAVING MULTILAYER STRUCTURE

[75] Inventors: Shigeo Fujita, Kyoto; Shizuo Fujita, Neyagawa, both of Japan

[73] Assignee: Seiwa Electric Mfg. Co., Ltd., Kyoto, Japan

[21] Appl. No.: 836,428

[22] Filed: Feb. 18, 1992

[30] Foreign Application Priority Data

Feb. 21, 1991 [JP] Japan ................................ 3-027065

[51] Int. Cl.$^5$ ................... H01L 29/161; H01L 29/205
[52] U.S. Cl. ........................................ 257/14; 257/22; 257/94; 257/103; 257/183; 372/45; 372/46
[58] Field of Search .................. 257/13, 14, 15, 94, 257/96, 97, 17, 18, 20, 21, 22, 103, 184, 192, 201, 183; 372/45, 46

[56] References Cited

U.S. PATENT DOCUMENTS

| | | | |
|---|---|---|---|
| 4,794,606 | 12/1988 | Kondow et al. | 372/45 |
| 5,045,894 | 9/1991 | Migita et al. | 257/94 |
| 5,045,897 | 9/1991 | Ahlgren | 257/103 |
| 5,081,632 | 1/1992 | Migita et al. | 372/45 |

FOREIGN PATENT DOCUMENTS

| | | | |
|---|---|---|---|
| 1-169985 | 7/1989 | Japan | 372/45 |
| 2-125477 | 5/1990 | Japan | 257/96 |

OTHER PUBLICATIONS

"Nearly Room-Temperature Photopumped Blue Lasers in ZnS$_x$Se$_{1-x}$/ZnSe Multilayer Structures", Koichiro Nakanishi et al., Extended Abstract of Conference on Solid State Devices and Materials, (1990), pp. 621–624.

"Room-Temperature Blue Lasing Action in (Zn,Cd)Se/ZnSe Optically Pumped Multiple Quantum Well Structures on Lattice-Matched (Ga,In) As Substrates", Applied Physics Letters, (1990), vol. 57, No. 23, pp. 2413–2415.

*Primary Examiner*—Rolf Hille
*Assistant Examiner*—Minhloan Tran
*Attorney, Agent, or Firm*—Wenderoth, Lind & Ponack

[57] ABSTRACT

ZnSSE mixed crystal semiconductors and ZnCdSe mixed crystal semiconductors are alternately laminated on a single crystal substrate composed of a III-V or II-VI compound to form a light emitting semiconductor device of a multilayer structure so that electrons and holes are efficiently confined therein. This increases the carrier recombination probability and emission efficiency. A device may be arranged where mixed crystal semiconductors of two types respectively having different component compositions of $Zn_{1-x1}Cd_{x1}S_{y1}Se_{1-y1}$ and $Zn_{1-x2}Cd_{x2}S_{y2}Se_{1-y2}$ are alternately laminated on a single crystal substrate composed of a III-V or II-VI compound such that the ratio of components of the mixed crystal semiconductors of two types satisfies the relationship that $x_1$ is smaller than $x_2$ and $y_1$ is greater than $y_2$. Alternately, a device may be arranged where a $Zn_{1-x}Cd_xS_ySe_{1-y}$ layer is formed on a single crystal substrate composed of a III-V or II-VI compound, a $Zn_{1-x1}Cd_{x1}S_{y1}Se_{1-y1}$ layer is formed on the $Zn_{1-x}Cd_xS_ySe_{1-y}$ layer, and a $ZnS_{y2}Se_{1-y2}$ layer is formed on the $Zn_{1-x1}Cd_{x1}S_{y1}Se_{1-y1}$, such that each of the $Zn_{1-x}Cd_xS_ySe_{1-y}$ and the $ZnS_{y2}Se_{1-y2}$ has a lattice constant substantially equal to that of the substrate and the $Zn_{1-x1}Cd_{x1}S_{y1}Se_{1-y1}$ has a lattice constant different from that of the substrate.

6 Claims, 6 Drawing Sheets

LIGHT EMITTING SEMICONDUCTOR DEVICE HAVING MULTILAYER STRUCTURE

BACKGROUND OF THE INVENTION

The present invention relates to a semiconductor device such as a light emitting diode, a laser diode or the like used in optoelectronics or the like.

FIG. 11 is a schematic section view of a first example of a conventional semiconductor device.

This semiconductor device uses a GaAs substrate 10 of III-V semiconductors reported in, for example, "Extended Abstract of Conference on Solid State Devices and Materials (1990)", pages 621 to 624. An n-ZnSSe epitaxial cladding layer 12 is formed on the GaAs substrate 10. Alternately laminated on the n-ZnSSe epitaxial cladding layer 12 are a plurality of n-ZnSSe epitaxial layers 13 and a plurality of n-ZnSe epitaxial layers 14. A p-ZnSSe epitaxial cladding layer 15 is formed on the uppermost n-ZnSSe epitaxial layer 13. Resistive metallic electrodes 16, 17 are respectively formed above the p-ZnSSe epitaxial cladding layer 15 and below the GaAs substrate 10.

In the semiconductor device having the arrangement above-mentioned, the band gap in the n-ZnSSe epitaxial layer 13 is greater than that in the n-ZnSe epitaxial layer 14, the difference in conduction band energy between the layers 13, 14 is as small as about 50 meV or less and the difference in value band energy between the layers 13, 14 is substantially equal to the difference in band gap energy. Accordingly, holes are efficiently confined in a multilayer structure of ZnSSe/ZnSe and recombined with electrons entering this multilayer structure, thus emitting blue light.

FIG. 12 is a schematic section view of a second example of the conventional semiconductor device.

This semiconductor device uses a GaAs substrate 101 of III-V semiconductors reported in, for example, "Applied Physics Letters (1990)" Volume 57, No. 23, pages 2413 to 2415. An n-ZnSe epitaxial cladding layer 22 is formed on the InGaAs substrate 101. Alternately laminated on the n-ZnSe epitaxial cladding layer 22 are a plurality of n-ZnSe epitaxial layers 23 and a plurality of n-ZnCdSe epitaxial layers 24. A p-ZnSe epitaxial cladding layer 25 is formed on the uppermost n-ZnSe epitaxial layer 23. Resistive metallic electrodes 16, 17 are respectively formed above the p-ZnSe epitaxial cladding layer 25 and below the InGaAs substrate 101.

In the semiconductor device having the arrangement mentioned above, the band gap in the n-ZnSe epitaxial layer 23 is greater than that in the n-ZnCdSe epitaxial layer 24, the difference in value band energy between the layers 23, 24 is as small as about 50 meV or less and the difference in conduction band energy between the layers 23, 24 is substantially equal to the difference in band gap energy. Accordingly, electrons are efficiently confined in a multilayer structure of ZnSe/ZnCdSe and recombined with holes entering this multilayer structure, thus emitting light from green to blue.

In the conventional semiconductor device in FIG. 11, the holes can be confined in the multilayer structure, but the electron cannot be confined satisfactorily due to small conduction band offset.

In the conventional semiconductor device in FIG. 12, the electrons can be confined in the multilayer structure, but the holes cannot be confined satisfactorily due to small value band offset.

Thus, either only one of the electrons or holes can be efficiently confined in the multilayer structure. This lowers the carrier in recombination probability, resulting in a decrease in internal quantum efficiency.

To enhance the carrier recombination probability to increase the internal quantum efficiency, it is desired to provide a semiconductor device having such an arrangement that both electrons and holes can be efficiently confined in the multilayer structure, i.e., an arrangement in which both conduction band offset and value band offset are sufficient.

OBJECTS AND SUMMARY OF THE INVENTION

It is an object of the present invention to provide a semiconductor device which is arranged to efficiently confine electrons and holes and which presents a high internal quantum efficiency.

To achieve the above-mentioned object, the semiconductor device according to the present invention is so arranged as to be realized with the use of any of the following means.

The semiconductor device of the present invention has, as first means, an arrangement in which ZnSSe mixed crystal semiconductors and ZnCdSe mixed crystal semiconductors are alternately laminated on a single crystal substrate of a III-V or II-VI compound.

The semiconductor device of the present invention has, as second means, an arrangement in which two types of mixed crystal semiconductors respectively having compositions of $Zn_{1-x1}Cd_{x1}S_{y1}Se_{1-y1}$ and $Zn_{1-x2}Cd_{x2}S_{y2}Se_{1-y2}$ are alternately laminated on the single crystal substrate used in the first means. In this semiconductor device, the mole fractions of these two types of mixed crystal semiconductors are arranged such that $x_1$ is smaller than $x_2$ and $y_1$ is greater than $y_2$.

The semiconductor device of the present invention has, as third means, an arrangement in which a $Zn_{1-x}Cd_xS_ySe_{1-y}$ layer is formed on the single crystal substrate used in the first means, in which a $Zn_{1-x1}Cd_{x1}S_{y1}Se_{1-y1}$ layer is formed on the $Zn_{1-x}Cd_xS_ySe_{1-y}$ layer, and in which a $ZnS_{y2}Se_{1-y2}$ layer is formed on the $Zn_{1-x1}Cd_{x1}S_{y1}Se_{1-y1}$ layer. In this semiconductor device, each of the $Zn_{1-x}Cd_xS_ySe_{1-y}$ layer and the $ZnS_{y2}Se_{1-y2}$ layer has a lattice constant substantially equal to that of the substrate, and the $Zn_{1-x1}Cd_{x1}S_{y1}Se_{1-y1}$ has a lattice constant different from that of the substrate.

The following description will discuss the operation of the arrangement of the first means in which ZnSSe mixed crystal semiconductors and ZnCdSe mixed crystal semiconductors are alternately laminated.

Figure 5:
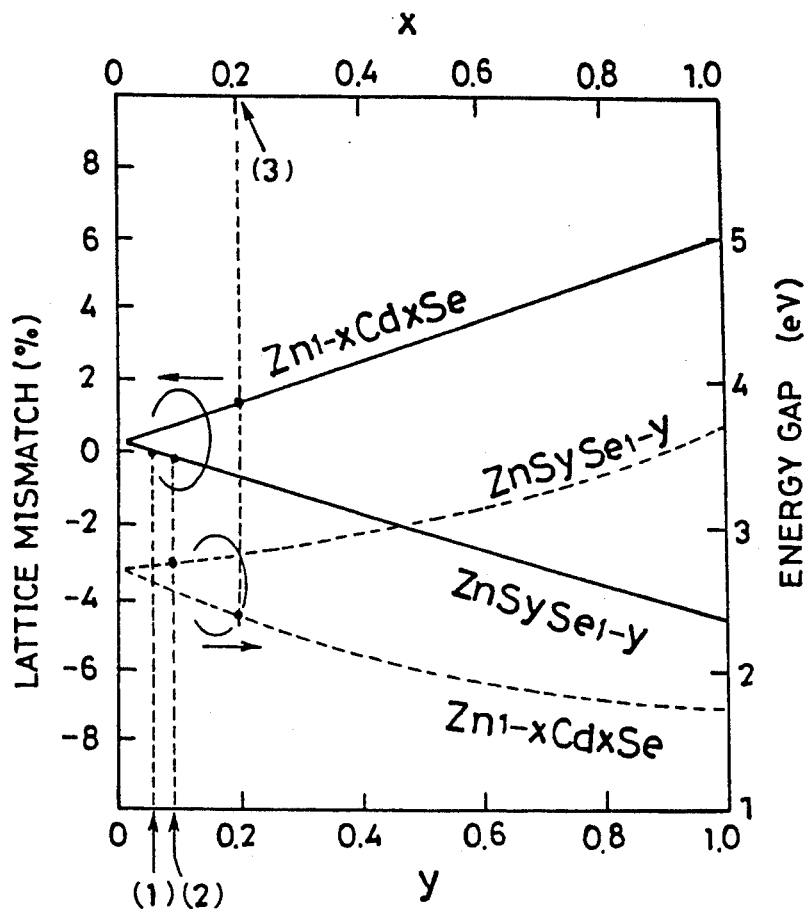
FIG. 5 is a view illustrating the operation of the first embodiment of the present invention and showing the compositions and lattice constants in a ZnSSe mixed crystal semiconductor and a ZnCdSe mixed crystal semiconductor.

FIG. 5 shows the band gaps and the lattice constants (represented in terms of degree of lattice mismatch with respect to GaAs) for the compositions x and y, in the $ZnS_ySe_{1-y}$ mixed crystal semiconductor in which ZnSe and ZnS are being mixed at a ratio of 1-y:y, and in the $Zn_{1-x}Cd_xSe$ mixed crystal semiconductor in which CdSe and ZnSe are being mixed at a ratio of x:1-x. In the $ZnZ_ySe_{1-y}$ mixed crystal semiconductor, as y increases, the lattice constant varies from 5.67Å for ZnSe (y=0) to 5.41Å for ZnS (y=1). At y=0.06 the lattice constant is 5.65Å which is equal to that for GaAs. The band gap varies from 2.70 eV for ZnSe (y=0) to 3.70 eV for ZnS (y=1). On the other hand, in the $Zn_{1-x}Cd_xSe$ mixed crystal semiconductor, as x increases, the lattice constant varies from 5.67Å for ZnSe (x=0) to 6.05Å for CdSe (x=1). The band gap varies from 2.70 eV for ZnSe (x=0) to 1.67 eV for CdSe (x=1). Now, there may be prepared, directly on the GaAs substrate or on a ZnSSe mixed crystal buffer layer having a composition in the vicinity of y=0.06 of the composition (1) substantially lattice-matched with the GaAs substrate or on a ZnSe, ZnSSe or ZnCdSSe buffer layer growing coherently with respect to the GaAs, a multilayer structure of ZnSSe layers each having the composition (2) in which y is greater than 0.06, and ZnCdSe layers each having the composition (3). In such a structure, the ZnSSe layers present tensile stress with respect to the substrate or the buffer layer, and the ZnCdSe layers present compressive stress with respect to the substrate or the buffer layer. Thus, the structure can grow coherently with respect to the substrate or the buffer layer as a whole.

Figure 6:
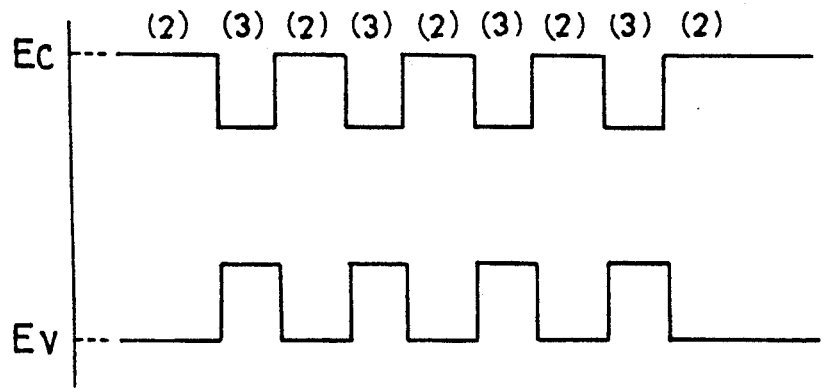
FIG. 6 is a view illustrating the operation of the first embodiment of the present invention and shows bands in an arrangement in which there are alternately laminated ZnSSe layers each having a composition (2) shown in FIG. 5 and ZnCdSe layers each having a composition (3) shown in FIG. 5.

FIG. 6 is a view of bands in an arrangement in which there are alternately laminated ZnSSe layers each having the composition (2) shown in FIG. 5 and ZnCdSe layers each having the composition (3) shown in FIG. 5. The band gap in ZnCdSe is smaller than the band gap in ZnSSe. The conduction band energy (Ec) is determined by the type of the II-element. As shown in FIG. 6, the band energy (Ec) of the ZnCdSe in which Zn contains Cd, is located in a position lower than that of the band energy (Ec) of the ZnSSe solely composed of Zn. The value band energy (Ev) is determined by the type of the VI-element. The value band energy (Ev) of ZnCdSe solely composed of Se is located in a position higher than that of the value band energy (Ev) of ZnSSe containing S in addition to Se. More specifically, each of the conduction band and the value band in this arrangement presents a great discontinuous band so that electrons and holes can be confined in the gaps between adjacent layers.

The following description will discuss the operation of the above-mentioned second means.

Figure 7:
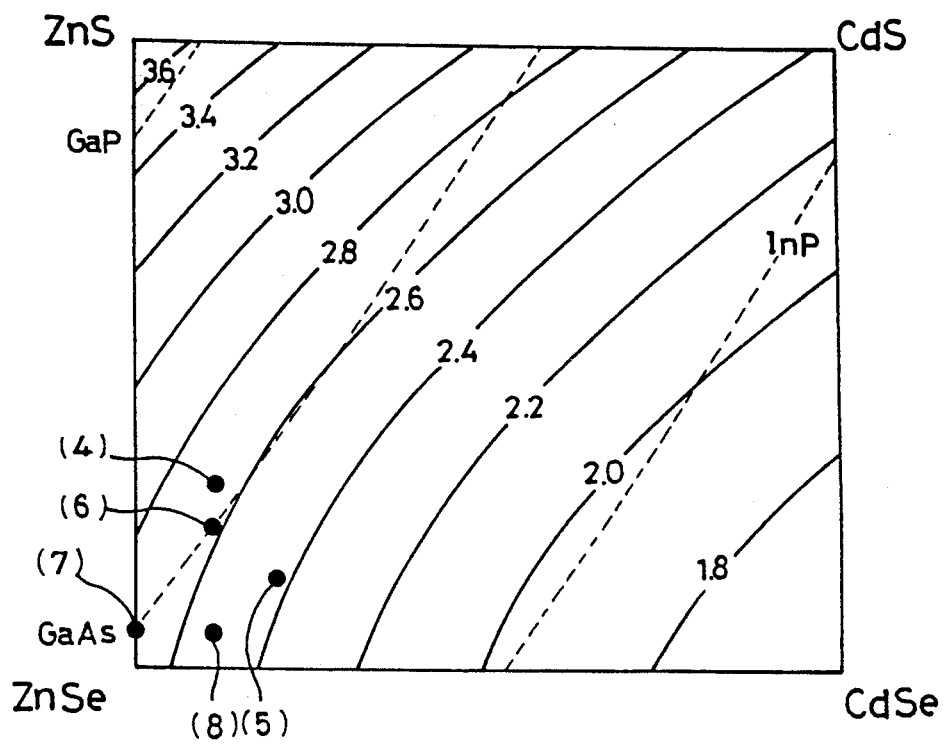
FIG. 7 is a view illustrating the operation of the first embodiment of the present invention and shows the lines of equal band gaps and the lines of equal lattice constants in a ZnCdSSe-type mixed crystal semiconductor.
Figure 8:
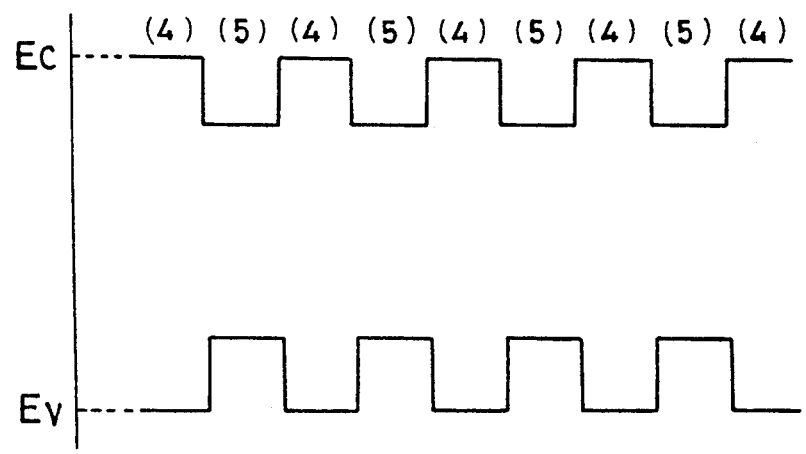
FIG. 8 is a view illustrating the operation of the first embodiment of the present invention and shows bands in an arrangement in which there are alternately laminated mixed crystal semiconductors respectively having compositions (4) and (5) in FIG. 7.

FIG. 7 is a view showing the lines of equal band gaps and the lines of equal lattice constants of a ZnCdSSe-type mixed crystal semiconductor comprising ZnSe, ZnS, CdSe and CdS. In FIG. 7, the lines of equal band gaps are shown by solid lines and the numerals therein represent band gap energy values in eV. In FIG. 7, the lines of equal lattice constants are shown by broken lines and represent the compositions of which lattice constants are equal to those of the single crystals GaP, GaAs and InP. Now, attention may be placed on the line of equal lattice constants of GaAs for example. In any of the compositions located in the upper left side with respect to this line, the lattice constant is smaller than that of GaAs, and in any of the compositions located in the lower right side with respect to this line, the lattice constant is greater than that of GaAs. Accordingly, in a ZnCdSSe mixed crystal semiconductor having two different compositions $Zn_{1-x1}Cd_{x1}S_{y1}Se_{1-y1}$ and $Zn_{1-x2}Cd_{x2}S_{y2}Se_{1-y2}$ of the layers (4) and (5), the layer (4) presents tensile stress on the GaAs substrate, while the layer (5) presents compressive stress. As a whole, such stresses offset each other and no great stress is applied to the semiconductor in its entirety. Selection is made such that the Cd composition of the layer (4) is smaller than that of the layer (5) and that the S composition of the layer (4) is greater than that of the layer (5). That is, provision is made such that the relationship that $x_1$ is smaller than $x_2$ and $y_1$ is greater than $y_2$, is satisfied. When the relationship is satisfied, the conduction band energy of the $Zn_{1-x1}Cd_{x1}S_{y1}Se_{1-y1}$ layer is located in a position upper than that of the conduction band energy of the $Zn_{1-x2}Cd_{x2}S_{y2}Se_{1-y2}$ layer, and the value band energy of the $Zn_{1-x1}Cd_{x1}S_{y1}Se_{1-y1}$ layer is located in a position lower than that of the value band energy of the $Zn_{1-x2}Cd_{x2}S_{y2}Se_{1-y2}$ layer, as shown in FIG. 8 illustrating bands in an arrangement in which a plurality of ZnCdSSe layers having the compositions (4) and (5) shown in FIG. 7 are alternately laminated. In this arrangement, each of the conduction band and the value band presents a great discontinuous band, so that electrons and holes can be confined in the gaps between adjacent layers.

The following description will discuss the operation of the third means mentioned earlier.

Figure 9:
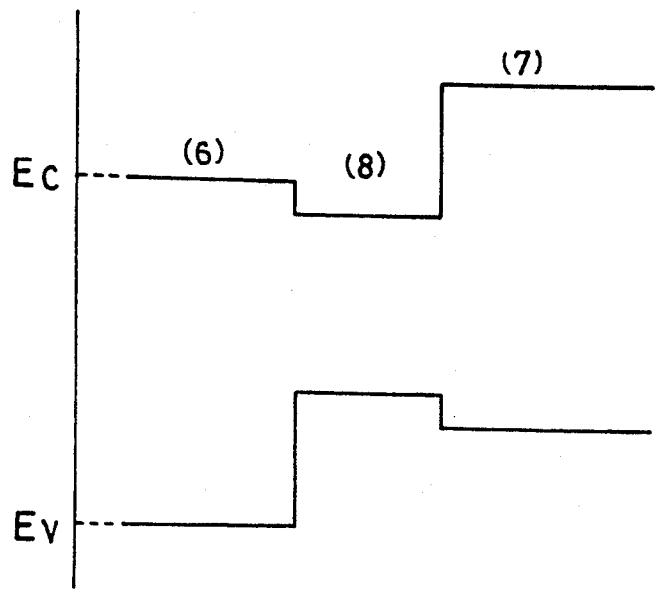
FIG. 9 is a view illustrating the operation of the first embodiment of the present invention and shows bands in an arrangement in which there are alternately laminated mixed crystal semiconductors respectively having compositions (6), (7) and (8) in FIG. 7.

There is formed a multilayer structure in which a $Zn_{1-x1}Cd_{x1}S_{y1}Se_{1-y1}$ layer having the composition (8) in FIG. 7 is sandwiched between a $Zn_{1-x}Cd_xS_ySe_{1-y}$ layer having the composition (6) in FIG. 7 and a $ZnS_{y2}Se_{1-y2}$ layer having the composition (7) in FIG. 7 each of which has a lattice constant substantially equal to that of the GaAs substrate. The $Zn_{1-x1}Cd_{x1}S_{y1}Se_{1-y1}$ layer has a lattice constant different from that of each of the $Zn_{1-x}Cd_xS_ySe_{1-y}$ layer and the $ZnS_{y2}Se_{1-y2}$ layer, and has a small band gap. This structure presents bands shown in FIG. 9. Thus, both electrons and holes can be confined in the $Zn_{1-x1}Cd_{x1}S_{y1}Se_{1-y1}$ layer. In this case, when the relationship that x is smaller than $x_1$ and y is greater than $y_1$, is satisfied, the conduction band offset between the layers (7) and (8) becomes great and the value band offset between the layer (6) and the layer (8) becomes great. If such combination of these compositions causes the distortion of the layer (8) to become great, provision is made such that x is equal to $x_1$ and y is equal to $y_1$. This prevents the layer (8) from being distorted and relatively increases the value band offset between the layers (6) and (8). Thus, both electrons and holes can be confined in the gaps between adjacent layers.

According to the semiconductor device having the above-mentioned arrangement, each of the conduction band and the value band presents a great discontinuous band, thus enabling both electrons and holes to be confined in the gaps between adjacent layers. This results in a increase in the recombination probability of the electrons and the holes. Accordingly, there may be obtained laser oscillation and emission of lights from green to blue with a high internal quantum efficiency.

DESCRIPTION OF THE PREFERRED EMBODIMENTS

The following description will discuss preferred embodiments of the present invention with reference to the attached drawings.

First Embodiment

Figure 1:
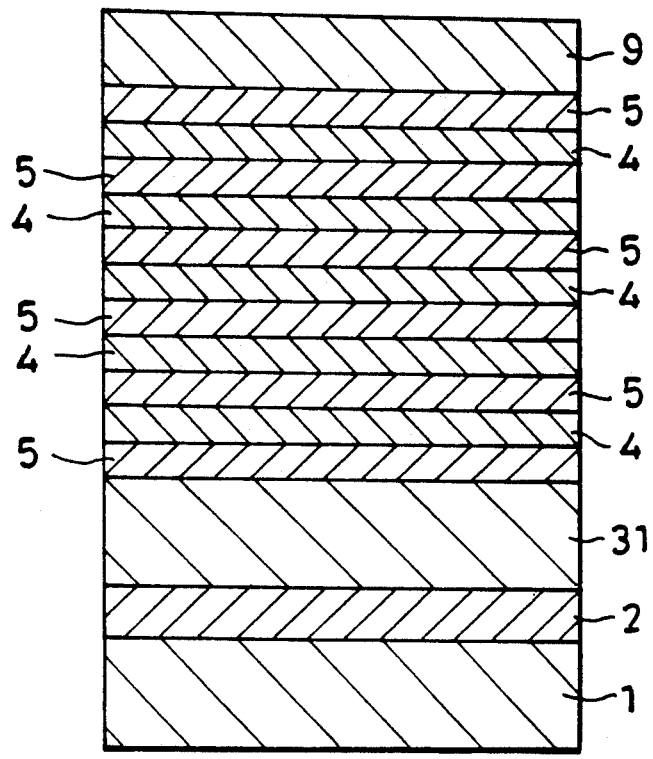
FIG. 1 is a schematic section view of a ZnSSe/ZnCdSe multilayer structure in accordance with a first embodiment of the present invention.

FIG. 1 is a schematic section view of a first embodiment of the present invention.

Formed on a GaAs substrate 1 is a ZnSe buffer layer 2 having a thickness of 300Å, on which there is formed a $ZnS_{0.08}Se_{0.92}$ buffer layer 31 having a thickness of 3500Å. Thus, the ZnSe buffer layer 2 is formed between the GaAs substrate 1 and the $ZnS_{0.08}Se_{0.92}$ buffer layer 31. This is because the surface of the $ZnZ_{0.08}Se_{0.92}$ buffer layer 31 becomes more smooth than the arrangement in which the $ZnS_{0.08}Se_{0.92}$ buffer layer 31 is formed directly on the GaAs substrate 1.

Alternately laminated on the $ZnS_{0.08}Se_{0.92}$ buffer layer 31 are $Zn_{0.80}Cd_{0.20}Se$ layers 5 each having a thickness of 80Å and $ZnS_{0.08}Se_{0.92}$ layers 4 each having a thickness of 120Å. This is a so-called multiple quantum well structure (MQW) having well layers and barrier layers. Further formed on the uppermost $Zn_{0.80}Cd_{0.20}Se$ layer 5 is a cap layer 9 having a thickness of 1000Å which forms the top layer. In this embodiment, six well layers and five barrier layers are formed.

When x-ray diffraction measurements were conducted on these layers forming the MQW structure, it was found that each layer had a tetragonally distorted zincblende structure and presented a coherent growth.

According to results obtained with the use of an oscillogram having a RHEED monitor, it was found that the mismatch rates of the $ZnS_{0.08}Se_{0.92}$ layers 4 and $Zn_{0.80}Cd_{0.20}Se$ layers 5 with respect to the substrate were −0.10% and +1.61%, respectively. In the multilayer structure, the conduction band offset and the value band offset are as great as 305 meV and 81 meV, respectively. Accordingly, the electrons and holes can be efficiently confined in the active layers having the multilayer structure.

As a method of preparing such a multilayer structure, there is available a metalorganic molecular beam epitaxial growth (MOMBE) method using raw materials such as dimethylzinc, solid Cd, hydrogen sulfide, dimethylselenium or the like. The temperature of the substrate under growth is for example 300° C.

Figure 10:
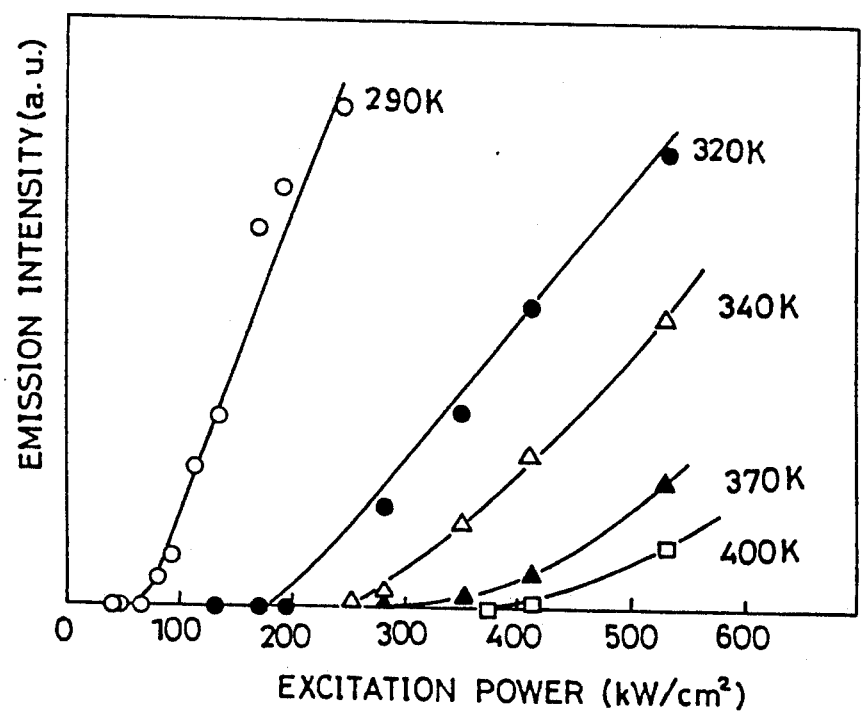
FIG. 10 is a view illustrating the operation of the first embodiment of the present invention and shows the relationship between excitation power and emission intensity at each of predetermined temperatures.
Figure 11:
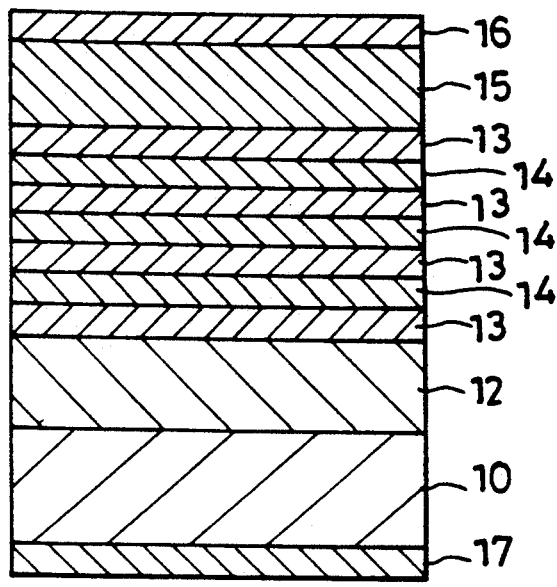
FIG. 11 is a schematic section view of a ZnSe/ZnSSe multilayer structure according to a first example of a conventional semiconductor device.
Figure 12:
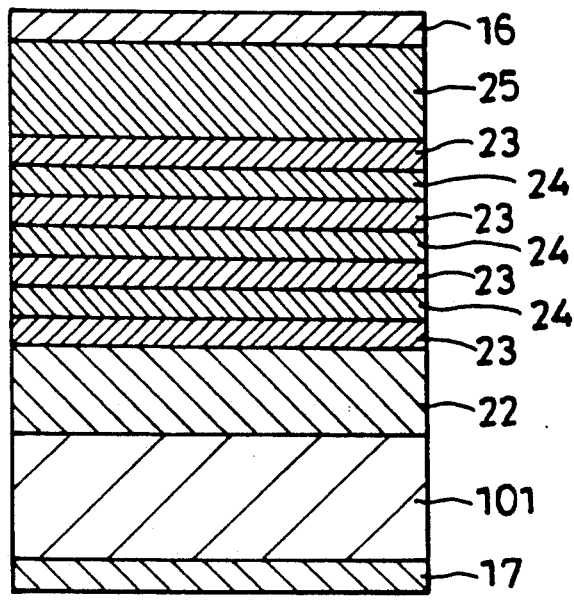
FIG. 12 is a schematic section view of a ZnCdSe/ZnSe multilayer structure according to a second example of the conventional semiconductor device.

FIG. 10 shows the relationship between excitation power and emission intensity as obtained at the time when nitrozen laser is irradiated onto a sample having the arrangement shown in FIG. 1 to generate laser oscillation. As apparent from FIG. 10, in a temperature from 290 to max. 400K, each emission intensity suddenly increases in a range exceeding the threshold of the excitation power at a predetermined temperature. From FIG. 10, it is also found that the half-width of each emission spectrum suddenly decreases to generate laser oscillation. The threshold $I_{th}$ is calculated by the following equation (1) where $T_0$ is 110° C:

$$I_{th} = \exp(T/T_0) \tag{1}$$

Second Embodiment

Figure 2:
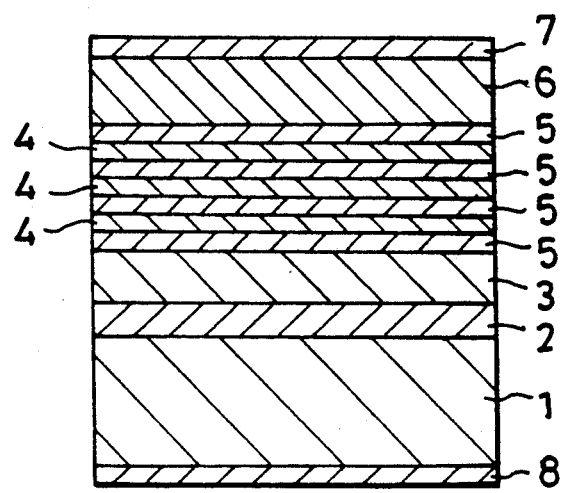
FIG. 2 is a schematic section view of a ZnSSe/ZnCdSe multilayer structure in accordance with a second embodiment of the present invention.

FIG. 2 is a schematic section view of a second embodiment of the present invention.

This embodiment has an arrangement similar to that shown in FIG. 1 and shows a laser diode adapted to generate laser oscillation when a current flows therein.

Formed on an n-GaAs substrate 1 is an n-ZnSe buffer layer 2, on which an $n-ZnS_{0.08}Se_{0.92}$ cladding layer 3 is formed. Alternately laminated on the $n-ZnS_{0.08}Se_{0.92}$ cladding layer 3 are $n-Zn_{0.80}Cd_{0.20}Se$ layers 5 and $n-ZnS_{0.08}Se_{0.92}$ layers 4. Thus, four $n-Zn_{0.80}Cd_{0.20}Se$ layers 5 are formed as well layers. A $p-ZnS_{0.08}Se_{0.92}$ cladding layer 6 is formed on the uppermost well layer, i.e., the $n-Zn_{0.80}Cd_{0.20}Se$ layer 5. Resistive metallic electrodes 7, 8 are respectively formed above the $p-ZnS_{0.08}Se_{0.92}$ cladding layer 6 and below the n-GaAs substrate 1.

In the second embodiment having the arrangement above-mentioned, electrons and holes are efficiently confined in the active layers, i.e., MQW multilayer structures where the $n-Zn_{0.80}Cd_{0.20}Se$ layers 5 and the $n-ZnS_{0.08}Se_{0.92}$ layers 4 are alternately laminated. Thus, the multilayer structures present high gain as the active layers. More specifically, when a positive voltage is applied to the resistive metallic electrode 7 and a negative voltage is applied to the resistive metallic electrode 8, a current flows and the electrons are efficiently recombined with the holes in the active layers so that light is emitted in a wavelength area of a blue-green color corresponding to the energy of the quantization level of the active layers.

In this embodiment, a pn-junction is formed, on the n-substrate, between the multilayer structure having the $n-ZnS_{0.08}Se_{0.92}$ layers 4 and the $n-Zn_{0.80}Cd_{0.20}Se$ layers 5, and the $p-ZnS_{0.08}Se_{0.92}$ cladding layer 6. However, each layer of the multilayer structure may be made of the p-type and a pn-junction may be formed between the multilayer structure and the $ZnS_{0.08}Se_{0.92}$ cladding layer 6. Further, a p-GaAs substrate may be used to form a multilayer structure in which p-layers and n-layers are alternately laminated. Further, the substrate may be made of ZnSe. Any of the above-mentioned arrangements can produce effects similar to those mentioned earlier.

Third Embodiment

Figure 3:
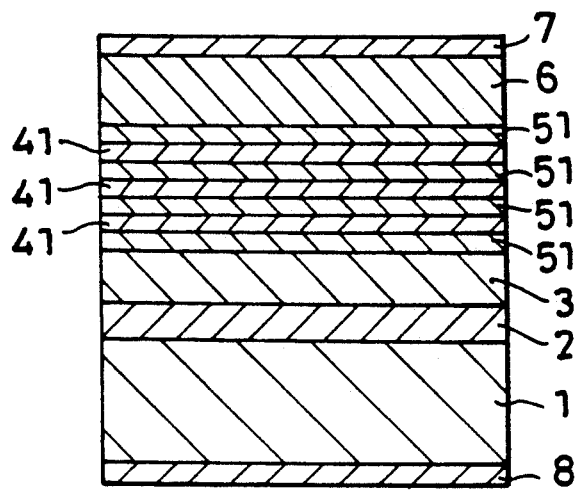
FIG. 3 is a schematic section view of a ZnCdSSe multilayer structure in accordance with a third embodiment of the present invention.

FIG. 3 is a schematic section view of a third embodiment of the present invention.

The third embodiment is arranged such that electrons and holes are confined in a multilayer structure of a ZnCdSSe mixed crystal semiconductor.

Formed on an n-GaAs substrate 1 is an n-ZnSe buffer layer 2, on which an n-ZnS$_{0.08}$Se$_{0.92}$ cladding layer 3 is formed. Alternately laminated on the n-ZnS$_{0.08}$Se$_{0.92}$ cladding layer 3 are n-Zn$_{0.80}$Cd$_{0.20}$S$_{0.05}$Se$_{0.95}$ layers 51 and n-Zn$_{0.88}$Cd$_{0.12}$S$_{0.30}$Se$_{0.70}$ layers 41. Thus, four n-Zn$_{0.80}$Cd$_{0.20}$S$_{0.05}$Se$_{0.95}$ layers 51 are formed as well layers. A p-ZnS$_{0.08}$Se$_{0.92}$ cladding layer 6 is formed on the uppermost well layer of the n-Zn$_{0.80}$Cd$_{0.20}$S$_{0.05}$Se$_{0.95}$ layer 51. Resistive metallic electrodes 7, 8 are respectively formed above the p-ZnS$_{0.08}$Se$_{0.92}$ cladding layer 6 and below the n-GaAs substrate 1.

In the third embodiment having the above-mentioned arrangement, the band gaps of the n-Zn$_{0.88}$Cd$_{0.12}$S$_{0.30}$Se$_{0.70}$ layers 41 are 2.72 ev, while the band gaps of the n-Zn$_{0.80}$Cd$_{0.20}$S$_{0.05}$Se$_{0.95}$ layers 51 are 2.41 eV. Thus, the band gaps of the n-Zn$_{0.88}$Cd$_{0.12}$S$_{0.30}$Se$_{0.70}$ layers 41 are greater than the band gaps of the n-Zn$_{0.80}$Cd$_{0.20}$S$_{0.05}$Se$_{0.95}$ layers 51. At the junctions of the layers 41, 51, the conduction band offset is as great as 160 meV and the value band offset is as great as 150 meV. Thus, the electrons and the holes are efficiently confined in the multilayer structure so that the active layers present high gain. More specifically, when a positive voltage is applied to the resistive metallic electrode 7 and a negative voltage is applied to the resistive metallic electrode 8, a current flows and the electrons are recombined with the holes in the active layers, so that light is emitted in a wavelength area of a blue-green color corresponding to the energy of the quantization level of the active layers.

In the third embodiment, too, the active layers may be made of the p-type and a p-GaAs substrate may be used to form a structure in which p-layers and n-layers are alternately laminated. Any of the above-mentioned arrangements can produce effects similar to those mentioned earlier.

Fourth Embodiment

Figure 4:
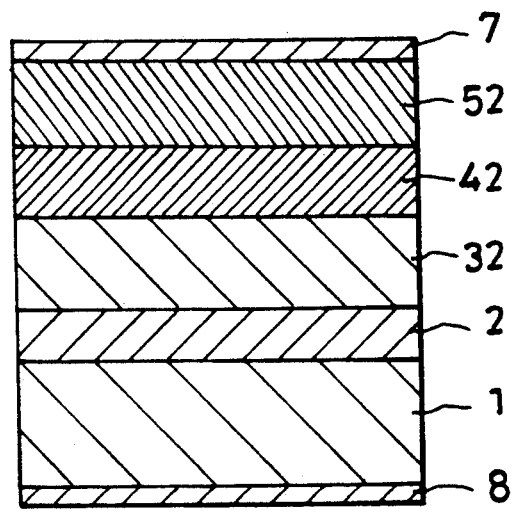
FIG. 4 is a schematic section view of a ZnSSe/ZnCdSSe/ZnCdSSe multilayer structure in accordance with a fourth embodiment of the present invention.

FIG. 4 is a schematic section view of a fourth embodiment of the present invention.

The fourth embodiment has a structure of ZnCdSSe/ZnCdSSe/ZnSSe. More specifically, an n-ZnSe buffer layer 2 is formed on an n-GaAs substrate 1, and an n-Zn$_{0.88}$Cd$_{0.12}$S$_{0.25}$Se$_{0.75}$ cladding layer 32 is formed on the ZnSe buffer layer 2. Formed on the n-Zn$_{0.88}$Cd$_{0.12}$S$_{0.25}$Se$_{0.75}$ cladding layer 32 is an n-Zn$_{0.88}$Cd$_{0.12}$S$_{0.08}$Se$_{0.92}$ active layer 42, on which there is formed a p-ZnS$_{0.08}$Se$_{0.92}$ cladding layer 52. Resistive metallic electrodes 7, 8 are respectively formed above the p-ZnS$_{0.08}$Se$_{0.92}$ cladding layer 52 and below the n-GaAs substrate 1.

In the fourth embodiment having the above-mentioned arrangement, when a positive voltage is applied to the resistive metallic electrode 7 and a negative voltage is applied to the resistive metallic electrode 8 so that a current flows, electrons flowing from the n-Zn$_{0.88}$Cd$_{0.12}$S$_{0.25}$Se$_{0.75}$ cladding layer 32 to the n-Zn$_{0.88}$Cd$_{0.12}$S$_{0.08}$Se$_{0.92}$ active layer 42 cannot readily flow in the p-ZnS$_{0.08}$Se$_{0.92}$ cladding layer 52 and stay in the n-Zn$_{0.88}$Cd$_{0.12}$S$_{0.08}$Se$_{0.92}$ active layer 42 because the energy of the conduction band of the p-ZnS$_{0.08}$Se$_{0.92}$ cladding layer 52 is located in a position higher than that of the conduction band energy of the n-Zn$_{0.88}$Cd$_{0.12}$S$_{0.08}$Se$_{0.92}$ active layer 42. On the other hand, the holes flowing from the p-ZnS$_{0.08}$Se$_{0.92}$ cladding layer 52 to the n-Zn$_{0.88}$Cd$_{0.12}$S$_{0.08}$Se$_{0.92}$ active layer 42 cannot readily flow in the n-Zn$_{0.88}$Cd$_{0.12}$S$_{0.25}$Se$_{0.75}$ cladding layer 32 and stay in the n-Zn$_{0.88}$Cd$_{0.12}$S$_{0.08}$Se$_{0.92}$ active layer 42 because the value band energy of the n-Zn$_{0.88}$Cd$_{0.12}$S$_{0.25}$Se$_{0.75}$ cladding layer 32 is located in a position higher than that of the value band energy of the n-Zn$_{0.88}$Cd$_{0.12}$S$_{0.08}$Se$_{0.92}$ active layer 42. More specifically, both electrons and holes stay in the n-Zn$_{0.88}$Cd$_{0.12}$S$_{0.08}$Se$_{0.92}$ active layer 42 and are efficiently recombined with each other therein, thus emitting light of a blue-green color corresponding to the active layer 42 band gap of 2.53 eV.

What is claimed is:

1. A semiconductor device comprising:
   a single crystal substrate composed of a III-V compound; and
   ZnSSe mixed crystal semiconductors and ZnCdSe mixed crystal semiconductors alternately laminated on said substrate.

2. A semiconductor device comprising:
   a single crystal substrate composed of a III-V compound; and
   mixed crystal semiconductors of two types respectively having component compositions of Zn$_{1-x1}$Cd$_{x1}$S$_{y1}$Se$_{1-y1}$ and Zn$_{1-x2}$Cd$_{x2}$S$_{y2}$Se$_{1-y2}$ alternately laminated on said substrate,
   the ratio of components of said mixed crystal semiconductors of two types satisfying the relationship that x$_1$ is smaller than x$_2$ and y$_1$ is greater than y$_2$.

3. A semiconductor device comprising:
   a single crystal substrate composed of a III-V compound;
   a Zn$_{1-x}$Cd$_x$S$_y$Se$_{1-y}$ layer formed on said substrate;
   a Zn$_{1-x1}$Cd$_{x1}$S$_{y1}$Se$_{1-y1}$ layer formed on said Zn$_{1-x}$Cd$_x$S$_y$Se$_{1-y}$ layer; and
   a ZnS$_{y2}$Se$_{1-y2}$ layer formed on said Zn$_{1-x1}$Cd$_{x1}$S$_{y1}$Se$_{1-y1}$;
   each of said Zn$_{1-x}$Cd$_x$S$_y$Se$_{1-y}$ and said ZnS$_{y2}$Se$_{1-y2}$ having a lattice constant substantially equal to that of said substrate,
   said Zn$_{1-x1}$Cd$_{x1}$S$_{y1}$Se$_{1-y1}$ having a lattice constant different from that of said substrate.

4. A semiconductor device comprising:
   a single crystal substrate composed of a II-VI compound; and
   ZnSSe mixed crystal semiconductors and ZnCdSe mixed crystal semiconductors alternately laminated on said substrate.

5. A semiconductor device comprising:
   a single crystal substrate composed of a II-VI compound; and
   mixed crystal semiconductors of two types respectively having component composition of Zn$_{1-x1}$Cd$_{x1}$S$_{y1}$Se$_{1-y1}$ and Zn$_{1-x2}$Cd$_{x2}$S$_{y2}$Se$_{1-y2}$ alternately laminated on said substrate,
   the ratio of components of said mixed crystal semiconductors of two types satisfying the relationship that x$_1$ is smaller than x$_2$ and y$_1$ is greater than y$_2$.

6. A semi conductor device comprising:
   a single crystal substrate composed of a II-VI compound;
   a Zn$_{1-x}$Cd$_x$S$_y$Se$_{1-y}$ layer formed on said substrate;

a $Zn_{1-x1}Cd_{x1}S_{y1}Se_{1-y1}$ layer formed on said $Zn_{1-x}Cd_xS_ySe_{1-y}$ layers; and a $ZnS_{y2}Se_{1-y2}$ layer formed on said $Zn_{1-x1}Cd_{x1}S_{y1}Se_{1-y1}$;

each of said $Zn_{1-x}Cd_xS_ySe_{1-y}$ and said $ZnS_{y2}Se_{1-y2}$ having a lattice constant substantially equal to that of said substrate, said $Zn_{1-x1}Cd_{x1}S_{y1}Se_{1-y1}$ having a lattice constant different from that of said substrate.

* * * * *